United States Patent [19]
Lopata et al.

[11] Patent Number: 6,012,928
[45] Date of Patent: Jan. 11, 2000

[54] MICROSTRIP EDGE CARD CONNECTOR

[75] Inventors: John E. Lopata, Redwood City; Jeremy Martin, Oakland, both of Calif.; Dennis Pak, Fairfax, Va.; Gregory David Spanier, Cupertino; Paul Quang Vo, San Jose, both of Calif.

[73] Assignee: Molex Incorporated, Lisle, Ill.

[21] Appl. No.: 09/143,704

[22] Filed: Aug. 28, 1998

[51] Int. Cl.⁷ .................................................. H01R 9/09
[52] U.S. Cl. ............................................. 439/67; 439/632
[58] Field of Search ............................... 439/67, 62, 493, 439/632, 260

[56] References Cited

U.S. PATENT DOCUMENTS

| | | | |
|---|---|---|---|
| 3,703,604 | 11/1972 | Henschen et al. | 174/75 |
| 4,798,918 | 1/1989 | Kabadi et al. | 174/36 |
| 5,007,842 | 4/1991 | Deak et al. | 439/66 |
| 5,300,899 | 4/1994 | Suski | 333/1 |
| 5,507,651 | 4/1996 | Tanaka et al. | 439/67 |
| 5,622,505 | 4/1997 | Hashiguchi | 439/67 |
| 5,675,299 | 10/1997 | Suski | 333/1 |
| 5,682,124 | 10/1997 | Suski | 333/1 |
| 5,911,584 | 6/1999 | Larsen et al. | 429/67 |
| 5,913,699 | 6/1999 | Zielke | 439/632 |

*Primary Examiner*—Steven L. Stephan
*Assistant Examiner*—J. F. Duverne
*Attorney, Agent, or Firm*—A. A. Tirva

[57] ABSTRACT

A circuit card connector that utilizes flexible circuitry includes an elongated base, a pair of cradle spring members supported on the base, and a pair of contact springs movably supported on the cradle spring members. The cradle spring members include a plurality of reset arms that extend upwardly therefrom into contact with the undersides of the flexible circuitry. The flexible circuitry includes an apertured ground plane layer spaced apart from and located beneath the signal face layer. The apertures in the ground plane layer increase its flexibility especially at the interconnection interfaces to increase the compliance of the connector.

27 Claims, 12 Drawing Sheets

MICROSTRIP EDGE CARD CONNECTOR

BACKGROUND OF THE INVENTION

The present invention relates generally to edge card connectors, and more particularly to connectors that utilize flexible circuitry as the connector contacts and which have increased compliance.

Connectors are well known in the art which provide a connection between a primary circuit board and a secondary circuit board and are commonly referred to in the art as edge card connectors. These connectors typically include an insulative housing having a slot extending lengthwise within the housing that receives an edge of the secondary circuit card and a plurality of contacts on opposing sides of the slot. These contacts are typically stamped and formed and thus such connectors are limited in their "pitch", i.e., the spacing between the contacts. Where the connector contacts are stamped and formed, the stamping and forming process limits the pitch that can be obtained to about 0.5 mm.

By using flexible circuitry for the contacts, smaller pitches of about 0.3 mm may be obtained. U.S. Pat. No. 5,679,018 issued October describes a card connector utilizing flexible circuitry and having a circuit card-engaging means that applies and maintains a contact force on the conductive traces that are formed on the circuit card. Although reliable, it has been discovered that this connector construction may possess some inherent disadvantages in its compliance aspect. For example, in such a connector, a solid ground plane is typically formed as part of the flexible circuitry, and signal circuitry is laid over the ground plane, but the ground plane ends before the interconnection interface areas. Were the ground plane to be continued into the interconnection areas, the solid characteristic of the ground plane would act to stiffen the flexible circuitry thereat and reduce the compliance aspect of the connector where it sometimes cannot fully mate with opposing contacts formed on the circuit board to which the connector is mounted in instances where there are variations in the circuit board.

Accordingly, a need for a flexible circuitry connector having increased compliance and improved ground plane areas exists.

SUMMARY OF THE INVENTION

The present invention overcomes these disadvantages by providing a circuit card connector having flexible circuitry with increased compliance that facilitates the ability of the flexible circuitry to conform to variations that it encounters in the printed circuit board to which it is mated.

Accordingly, it is a general object of the present invention to provide an improved circuit card connector that has a compliant flexible circuitry that extends through the interconnection interfaces of the connector and that has a structure that cooperatively spreads the connector opening force along the length of the connector card slot.

Another object of the present invention is to provide a circuit card connector utilizing flexible circuitry in which the flexible circuitry includes an apertured ground plane pattern disposed beneath the signal traces of the flexible circuitry, the ground plane pattern extending into the interconnection interface areas and the apertures thereof reducing the stiffness of the flexible circuitry in those areas while increasing the ground reference, flexibility and compliance thereof.

Yet another object of the present invention is to provide a circuit card connector utilizing flexible circuitry to provide a connection between a circuit board and a circuit cards, the flexible circuitry being supported on opposite sides of the connector card slot by a pair of contact springs that are movably supported on a pair of cradle members, the cradle members each having a plurality of arm members extending therefrom that project toward the flexible circuitry in a manner so as to partially support the flexible circuitry in place upon the connector and equally distribute along the length of the connector, the opening force required to separate the contact springs.

A yet further object of the present invention is to provide a circuit card connector utilizing flexible circuitry to effect a connection between a plurality of circuits on a circuit card and a plurality of circuits on a circuit board, the flexible circuitry being supported on opposite sides of a circuit card-receiving slot of the connector, the flexible circuitry being supported on a pair of contact springs that are movably mounted on a cradle, the contact springs having distinct arm and leg portions disposed on opposite sides of a mounting line thereof, the contact spring leg portions having alternating slots and tabs formed along their lower edges, that are interleaved when the contact springs are in a relaxed position without a circuit card present in the card-receiving slot, thereby increasing the size of the card-receiving opening of the connector.

A still further object of the present invention is to provide a flexible circuitry connector with a resilient layer or member having a compliant layer interspersed between conductive areas on the flexible circuitry and contact springs that support the flexible circuitry, the complaint layer being deformable under pressure by a circuit card in order to compensate for variations in the circuit board, but still effect a reliable connection.

In one principal aspect of the present invention and as exemplified by the preferred embodiment of the invention, an improved circuit card connector is provided with two matching lengths of flexible circuitry aligned on opposite sides of the card slot, the flexible circuitry including a plurality of signal traces and a common ground plane spaced apart from the signal traces. The ground plane is apertured throughout its extent and contains a plurality of openings formed therein that are aligned with the signal traces, preferably so that the openings lie between adjoining signal traces. This ground plane pattern extends through the interconnection interface areas where the apertures increase the flexibility of the circuitry and cooperate with the compliant material so that the ability of the flexible circuitry to conform to variations in the printed circuit board to which it is mounted is enhanced.

In another principal aspect of the present invention, the flexible circuitry supporting structure of the connector includes a pair of cradle spring members that engage the base of the connector and extent for the length thereof an opposite sides of the card-receiving slot. The use of two such cradle spring members provides the connector with an ability to accept various edge card thickness.

In yet another principal aspect of the present invention, each of the cradle spring members includes a plurality of reset members, preferably in the form of elongated arms formed with the spring members and extending outwardly therefrom. In their outward extent, the reset arms contact the underside of the flexible circuitry extends at equal intervals along the length of the connector. These reset arms serve to equally distribute and spread out the force required to open the contact springs that support the card-contacting edges of the flexible circuitry.

In still another principal aspect of the present invention and as exemplified by an alternate embodiment thereof, the reset members are interconnected by common elements extending lengthwise along the connector at free ends thereof so as to preclude the imposition of high point forces upon the flexible circuitry and to prevent the formation of indentations therein.

These and other objects, features and advantages of the present invention will be clearly understood through a consideration of the following detailed description.

BRIEF DESCRIPTION OF THE DRAWINGS

In the course of the following description of the detailed description, reference will be made to the attached drawings wherein like reference numerals identify like parts and wherein:

FIG. 17A is a view similar to that of FIG. 8, but illustrating an alternate reset mechanism; and, FIG. 17B is a perspective view of a cradle spring member using the alternate reset mechanism of FIG. 17A.

DETAILED DESCRIPTION OF THE PREFERRED EMBODIMENT

The Structure of the Prior Art

Figure 1:
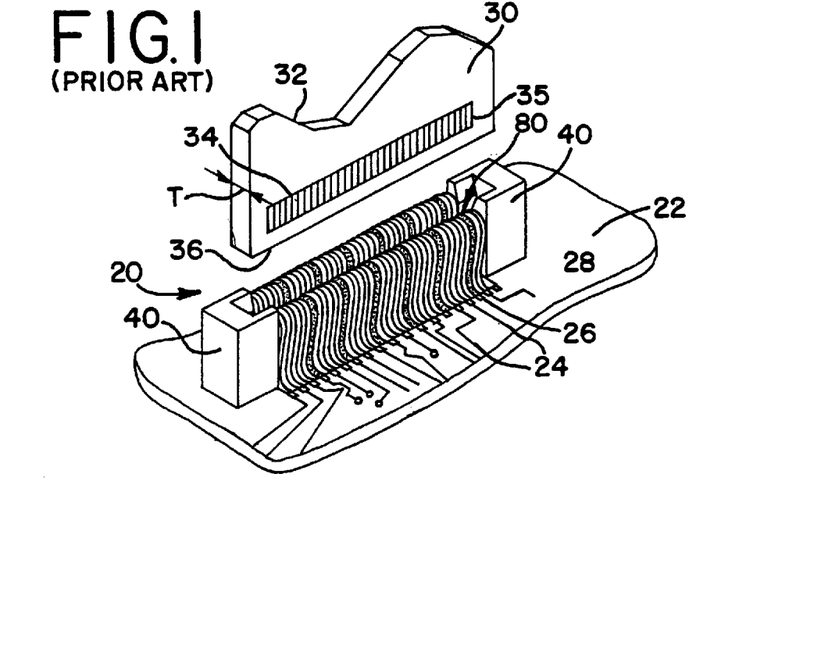
FIG. 1 is a perspective view of a prior art circuit card connector and circuit card that exemplifies the field of use and the type of connectors in which the present invention finds it greatest utility.

FIG. 1 illustrates a prior art card connector, generally indicated at 20, constructed in accordance with the principles of the present invention. This connector and its constructions are described in U.S. Pat. No. 5,679,018 for "Circuit Card Connector Utilizing Flexible Film Circuitry" and which is assigned to the assignee of the present invention. The disclosure of this patent application is incorporated by reference herein.

Turning to FIG. 1, a known connector 20 is depicted and illustrates the type and style of circuit card connectors to which the present invention is directed. The connector 20 is mounted to a primary printed circuit board 22 having a plurality of different circuits 24 disposed thereon leading to a plurality of associated contact pads, or traces 26, located on a mounting surface 28 of the circuit board 22.

The connector 20 is intended to provide a connection between the circuit board 22 and a secondary circuit card 30 having a generally planar substrate 32 and a plurality of contact pads 34 aligned with an insertion edge 36 of the circuit card 30. The circuit card 30 has its contact pads 34 disposed on both sides thereof, typically arranged in an array of one or more distinct rows 35 proximate to the insertion edge 36. These contact pads 34 may, if desired, be electrically connected in ways well known in the art to provide redundant contact surfaces in order to enhance the reliability of the circuit card-connector connection.

Figure 2:
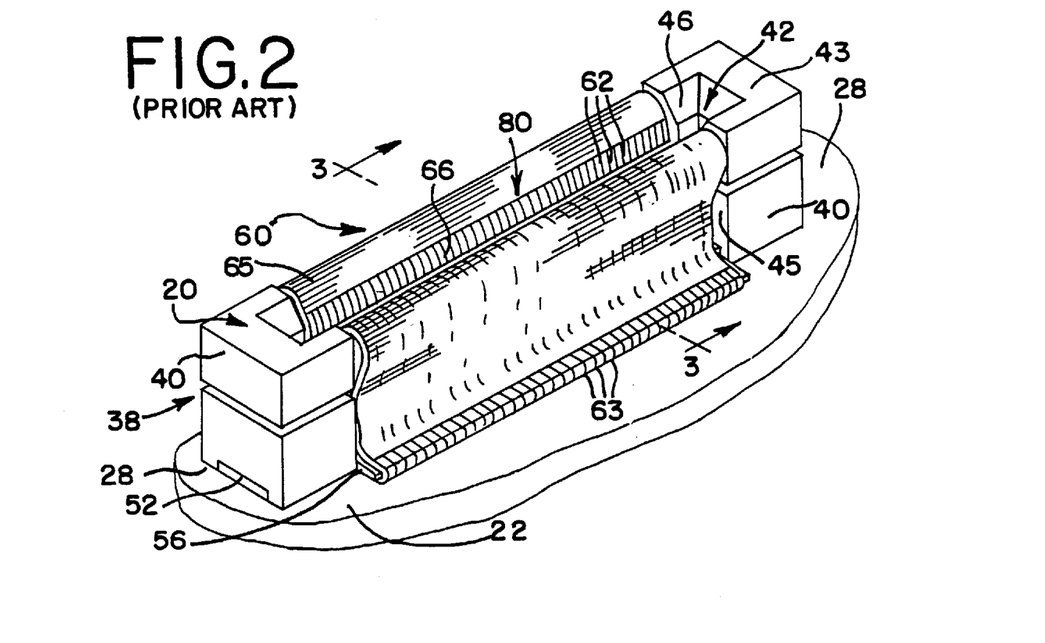
FIG. 2 is an enlarged perspective view of the connector of FIG. 1.

Turning now to FIG. 2, it can be seen that the connector 20 has a housing, or body 38, that extends lengthwise and which generally includes two opposing end portions 40, preferably which are formed from an electrically insulative material, such as plastic. These end portions 40, serve to define the overall length of the connector 20 and its housing, as well as the longitudinal extent of a circuit card-receiving slot 80 of the connector 20. In this regard, the end portions 40, each include a recess 42 formed therein, which extends down from the upper surfaces 43 thereof to a predetermined depth D. (FIG. 3.)

These recesses 42 communicate with the interior, opposing faces 45 of the end portions 40 and may include in proximity to the upper surface 43, ramped portions 46, that provide lead-in surfaces into the recesses 42 to facilitate entry of the circuit card 30 into the connector card-receiving slot 80. Although the housing shown is defined by the two spaced-apart end portions 40 and the connector base 54 as illustrated in FIG. 4, it will be understood that the term "connector housing" as used herein is to be given its broadest interpretation and, as such, is intended to include connector structures that have longitudinal sidewalls which extend the entire length of the connector 20.

Figures 3, 4:
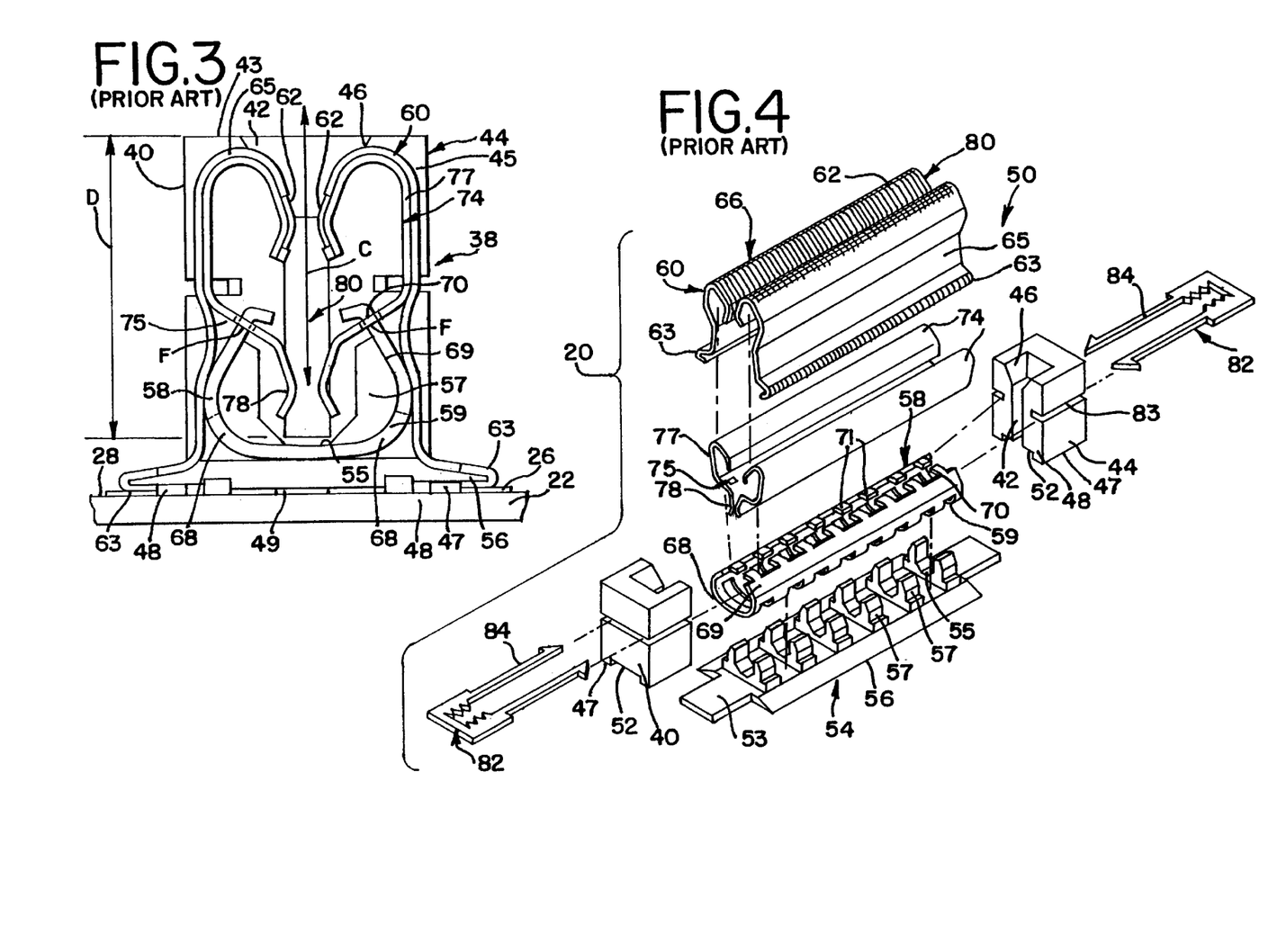
FIG. 3 is a sectional view of the connector of FIG. 2 taken along lines 3—3 thereof.
FIG. 4 is an exploded perspective view of the connector of FIG. 2.

The lower surfaces 47 of the end portions 40 are adapted to sit on the circuit board surface 28 and may be provided, as illustrated in FIG. 3, with support portions 48 and mounting lugs or posts 49. The connector end portions 40 are preferably aligned lengthwise along a longitudinal axis of the connector 20 so that their respective recesses 42 confront each other and preferably so that they are maintained in registration with respect to a centerline C (FIG. 3) of the card-receiving slot 80 of the connector 20.

The connector end portions 40 not only define opposing ends of the connector circuit card-receiving slot 80 by way of their respective recesses 42, but they also support a circuit card-engagement assembly 50 therebetween. The components which make up this circuit card-engagement assembly 50 are best illustrated in FIG. 4. The connector circuit card-engagement assembly 50 includes two extents of flexible circuitry 60, that has a plurality of conductive traces, or contacts 66, formed thereon. These traces, as known in the art, are arranged in side-by-side order on flexible circuitry 60 and have first conductive portions 62 exposed in areas flanking the card-receiving slot 80 and second conductive portions 63 exposed at opposite ends thereof that oppose the mounting surface 28 of the circuit board 22. Such flexible circuitry 60 typically has a laminated construction utilizing flexible electrical contacts, or traces 66, formed from conductive metal foils and bonded to a flexible, electrically insulative layer such as a polyamide film. An outer insulative layer 65 may be utilized that overlies the contacts 66.

The connector end portions 40 may also include hollow cavities 52 formed in their lower surfaces that receive opposing end tabs 53 of a connector base member 54. The connector base member 54 extends lengthwise between the connector end portions 40 and has a width slightly greater than the end portions 40 in order to provide support for the flexible circuitry 60 of the connector 20. The base member 54 further has a flat central portion 55 (FIG. 3) which may be considered as defining the lowermost extent of the card-receiving slot 80.

The connector base 54 may further include foot portions 56 that extend outwardly and which support the flexible circuitry 60 near the second conductive portions 63 thereof. A plurality of posts 57 extend upwardly from the base member 54. These posts 57 are spaced apart from each other both lengthwise and laterally within the connector 20 and further flank the base member central portions 55 to provide a preload, or biasing force to a one-piece cradle spring 58 of the card-engagement assembly 60 as explained in greater detail in said '018 patent. Additionally, the posts 57 of the connector base member 54 hold the cradle spring 58 in position to maintain a predetermined separation between the free ends of the cradle spring regardless of the tolerances to which the cradle spring may be made. The crosswise spacing occurs between pairs of posts 57 and is dependent on the intended thickness T of the circuit board 30 (FIG. 1) because of the single piece nature of the cradle spring 58.

The cradle spring 58 extends lengthwise between the connector end portions 40 and includes a plurality of transverse slots 59 which are spaced apart from each other in the longitudinal direction (FIG. 4). These slots 59 are dimensioned to receive the posts 57 of the base member 54. As seen in FIG. 4, the cradle spring 58 has a base portion 68 and two sidewalls 69 extending upwardly therefrom which terminate in free ends 70. The free ends 70 define in part fulcrums F (FIG. 3) for the card-engaging assembly 60. These fulcrums F lie on opposite sides of the centerline C of the connector 20 and of the card-receiving slot 80 and support a pair of contact springs 74. The free ends 70 of the cradle spring 58 preferably further include a series of engagement lugs 71 which serve to retain the contact springs 74 in place along the fulcrums F. These lugs 71 extend laterally inwardly from the cradle spring sidewalls 69 so that they engage the contact springs 74.

The posts 57 of the connector base member 54 preferably have a configuration as shown which will apply a predetermined or outwardly-directed biasing force against the cradle spring 58. A pair of contact springs 74 extend lengthwise along the cradle spring 58 and include spaced-apart openings 75 that extend lengthwise along the cradle spring 58 in a the same spacing as the cradle spring engagement lugs 71 so that when assembled, the contact springs 74 rest on the fulcrums F of the cradle spring and the engagement lugs 71 extend through the contact springs openings 75. The contact springs 74 may be considered as having in end profile, a general S-type shape, with distinct spring arms 77 and spring legs 78 located on opposite sides of the fulcrums F. The spring arm and legs 77, 78 can be seen to extend lengthwise along the connector 20 at different levels within the card-receiving slot 80.

The contact springs 74 serve as support surfaces for the flexible circuitry 60 which is applied to the outer surfaces of the contact spring arms 77. The flexible circuitry 60 extends down toward the connector base member 54 where the second conductive portions are aligned with and soldered to the contact pads 26 on the circuit board mounting surface 28. As illustrated in FIG. 4, a pair of retention clips 82 may be received within outer slots 83 of the connector end portions 40. These clips 82 are generally C-shaped and include a pair of arms 84 that extend longitudinally therefrom and engage the contact springs 74. These clips 82 apply a resistance force to the contact springs 74 that tends to hold them in an open position. This force is concentrated at the ends of the contact springs 74.

In operation of this known connector 20, a circuit card 30 is inserted into the card-receiving slot 80 of the connector 20. The insertion edge 36 of the circuit card 30 enters the slot 80 and initially contacts the spring leg portions 78 of each of the contact springs 74 and moves them outwardly with respect to their positions on the cradle spring 74. This movement causes the contact spring arm portions 77 and the first conductive portions of the flexible circuitry 60 supported thereon to more inwardly into contact with the circuit card. In such a construction, the force needed to open the contact springs may vary along the length of the connector.

THE STRUCTURE OF THE PRESENT INVENTION

Figure 5:
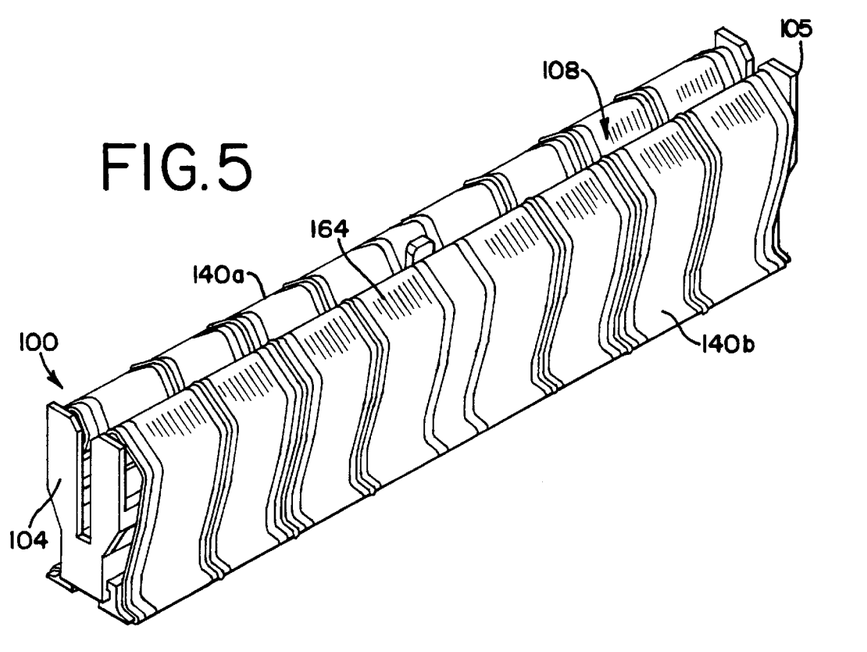
FIG. 5 is a perspective view of a connector flexible circuitry edge card constructed in accordance with the principles of the present invention.
Figure 6:
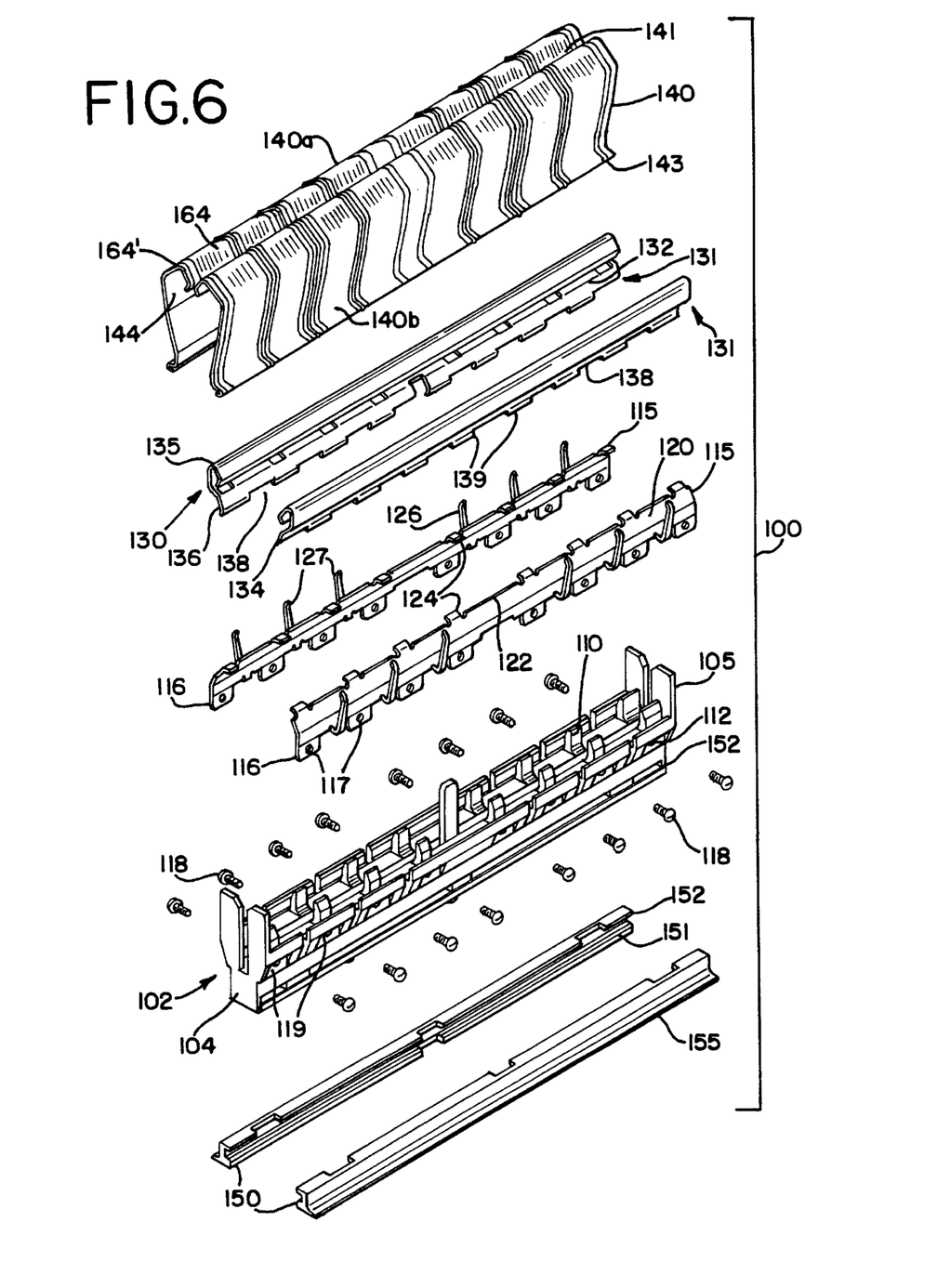
FIG. 6 is an exploded perspective view of the circuit card connector of FIG. 5.
Figure 7:
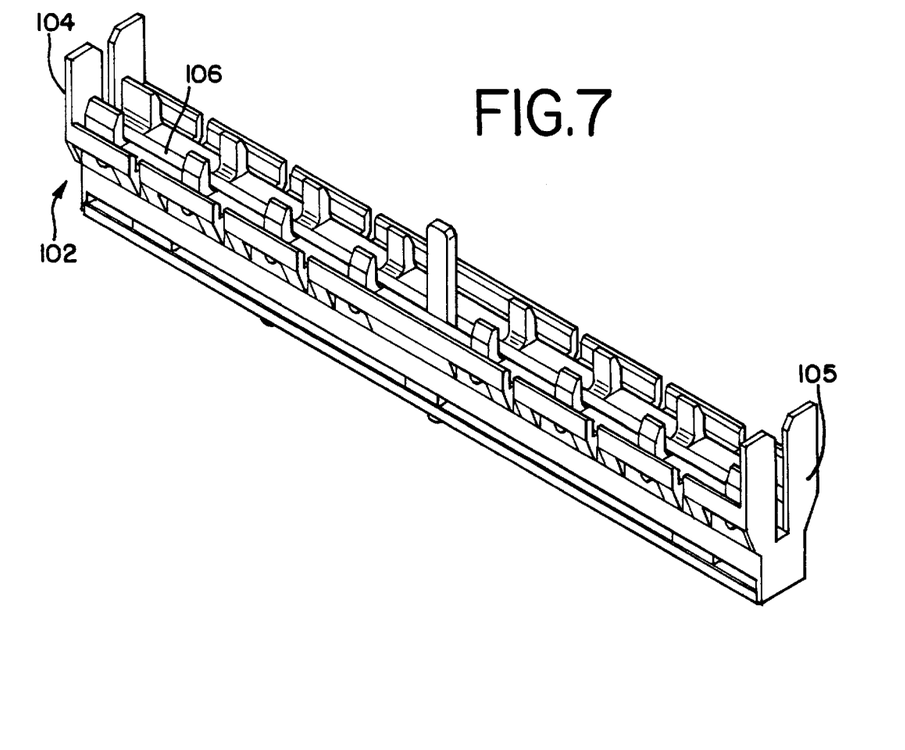
FIG. 7 is a perspective view of the circuit card connector of FIG. 5 with the flexible circuitry and cradle members removed for clarity and illustrating its base portion.

The present invention, in one principal aspect, overcomes this disadvantage. Turning now to FIGS. 5 and 6, one embodiment of an improved circuit card connector constructed in accordance with the principles of the present invention is designated generally at 100. The connector 100 includes an elongated base portion 102 that extends between two opposing end portions 104, 105 that define the overall length of the connector 100. A slot 106 runs lengthwise down the center of the base portion 102 and defines the bottom of the circuit card-receiving slot 108 of the connector 108.

The base portion 102 has a plurality of upstanding posts 110 that are spaced apart from each other at predetermined intervals along the length of the connector base portion 102 and which are disposed on opposite sides of the base portion slot 106. These posts 110 are spaced inwardly of a series of support walls 112 that extend lengthwise of the connector base portion 102 and the support walls 112 are divided into segments by intervening slots 113 formed therein.

Figures 8, 9B:
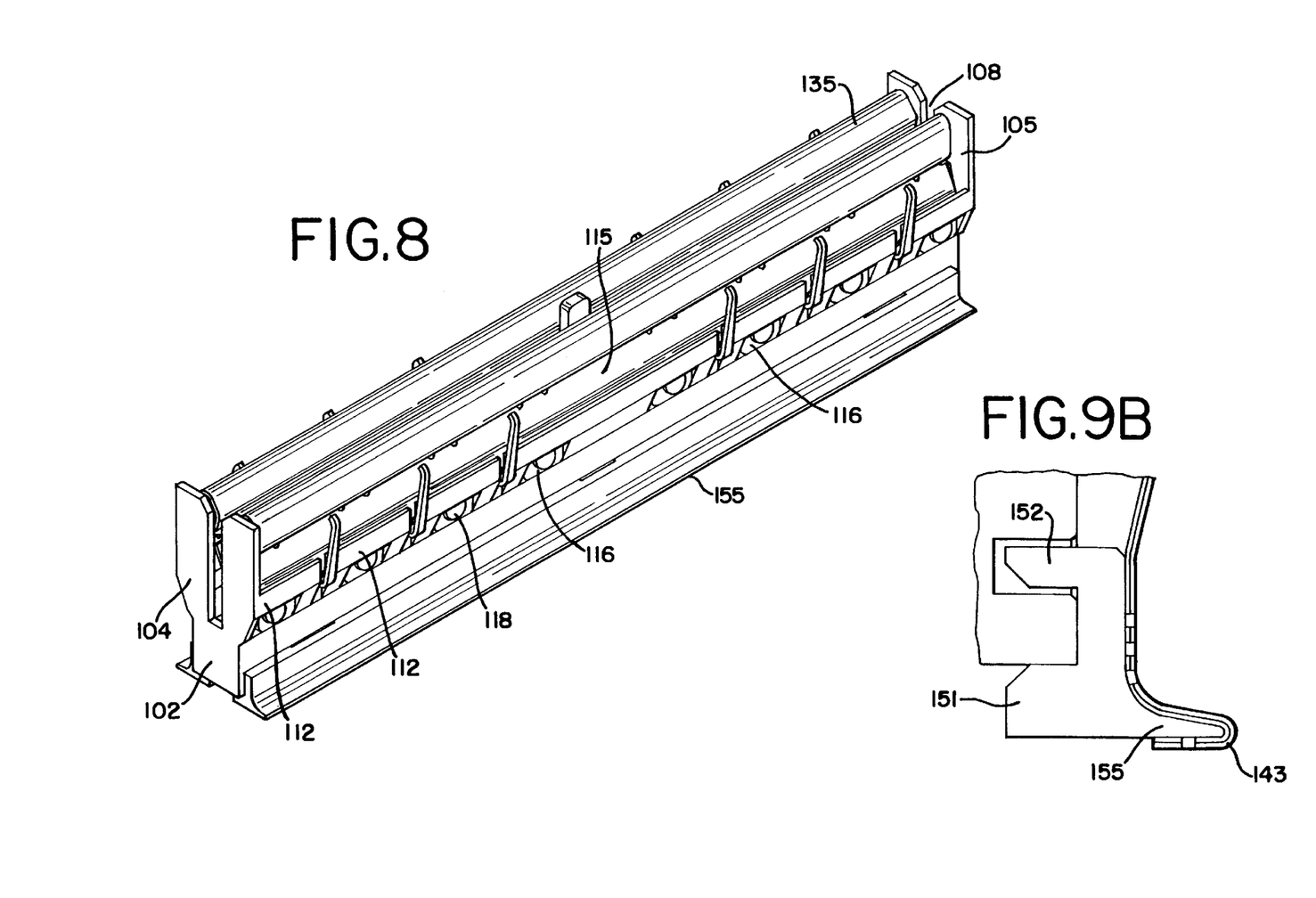
FIG. 8 is the same view as FIG. 7, but from a different angle and with the connector cradle and contact assembly springs in place thereon.
FIG. 9B is an enlarged detail sectional view of the area of contact between the base of the connector and the flexible circuitry.

In one important aspect of the present invention, a cradle, illustrated as a pair of cradle spring members 115, is provided to support the contact springs 130 of the connector 100 that in turn support the extents of flexible circuitry 140 thereon. The two cradle spring members 115 are supported upon the base portion 102 on opposite sides of the base slot 106. The cradle spring members 115, as illustrated in FIGS. 6 & 8, include a plurality of attachment flanges 116 formed along their lower extents and these flanges 116 have openings 117 formed therein that receive fasteners 118. The fasteners 118 join the cradle spring members 115 to the connector base portion 102 at predetermined intervals in registration with corresponding cavities 119. The upper cradle spring member 115 also include an upper, elongated shoulder portion 120 that extends at an angle to the lower attachment flanges 116.

Figure 9:
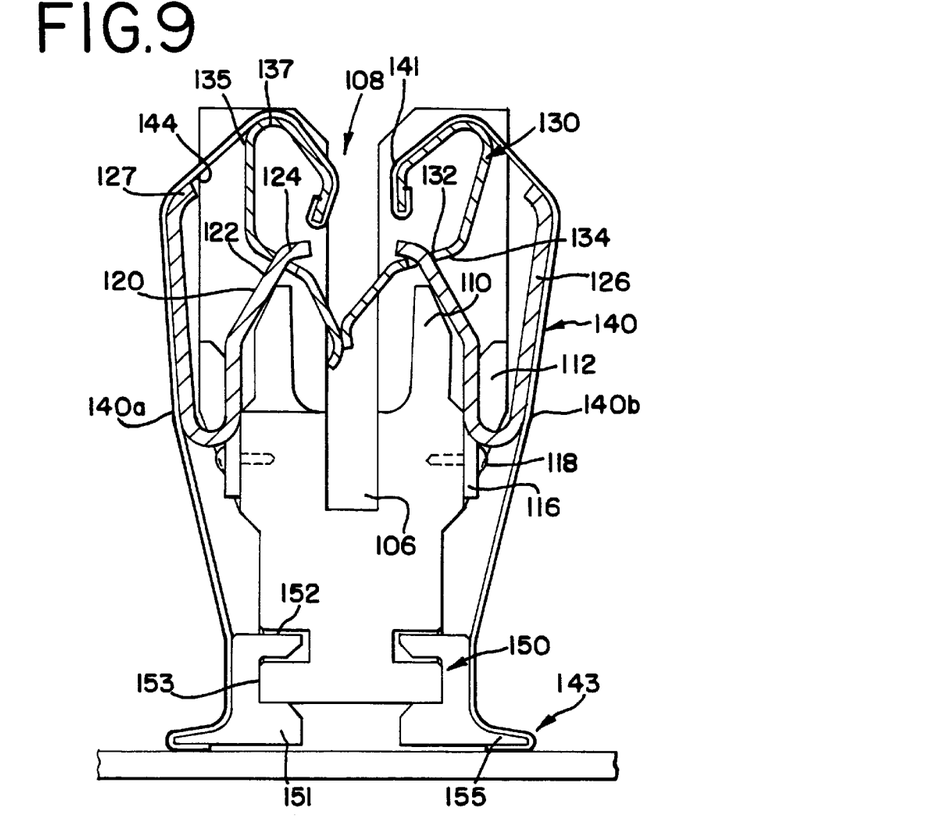
FIG. 9 is a sectional view of the connector of FIG. 5 in a rest condition, without a circuit card disposed therein.
Figure 9A:
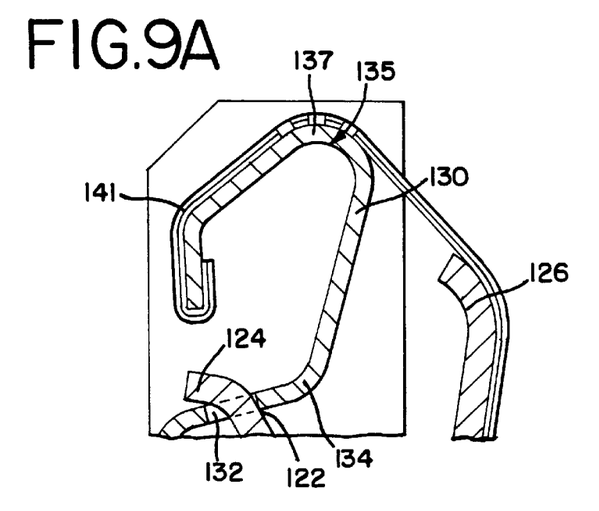
FIG. 9A is an enlarged detail sectional view of the area of contact between the contact spring and the flexible circuitry.

The base portion posts 110 are positioned and also preferably configured so that they contact the cradle spring shoulder portions 120 in order to limit the inward movement thereof with respect to the card-receiving slot 108. (FIG. 9). The cradle spring members 115 include, along the free ends 122 of the shoulder portions 120, a series of engagement lugs 124 that are spaced therealong lengthwise. These engagement lugs 124 are received within corresponding openings 132 formed in associated contact springs 130.

As illustrated best in FIGS. 6 & 9, the contact springs 130 have a somewhat S-shaped configuration and the openings 132 thereof are formed in intermediate portions 134 thereof, while upper spring arm portions 135 and lower spring leg portions 136 flank the intermediate portions 134. The contact springs 130 are free to move, or rock, about the free ends 122 of the cradle spring members 120 when engaged with the cradle spring engagement lugs 124. In this regard, the free ends 122 of the cradle spring members 120 can be considered as fulcrums, or fulcrum points about which the contact springs 130 will move under urging of various forces.

Two extents 140a, 140b of flexible circuitry 140 are supported on the contact springs 130, and a series of first contacts 141 of the circuitry 140 are disposed along the upper edges thereof and are supported by the spring arm portions 135 of the contact springs 130. The lower leg portions 136 of the contact springs 130 extend downward and extend, as best illustrated in FIG. 9, into the card-receiving slot 108 when the connector 100 is in a rest condition where no circuit card is inserted into the slot 108. As can be appreciated, when a circuit card is inserted into the card-receiving slot 108, the lower insertion edge of the circuit card will impinge upon the lower spring leg portions 136 and thereby cause the contact springs 130 to move toward each other about the cradle spring free ends 122, which as mentioned above, act as a pair of fulcrums.

Figure 16:
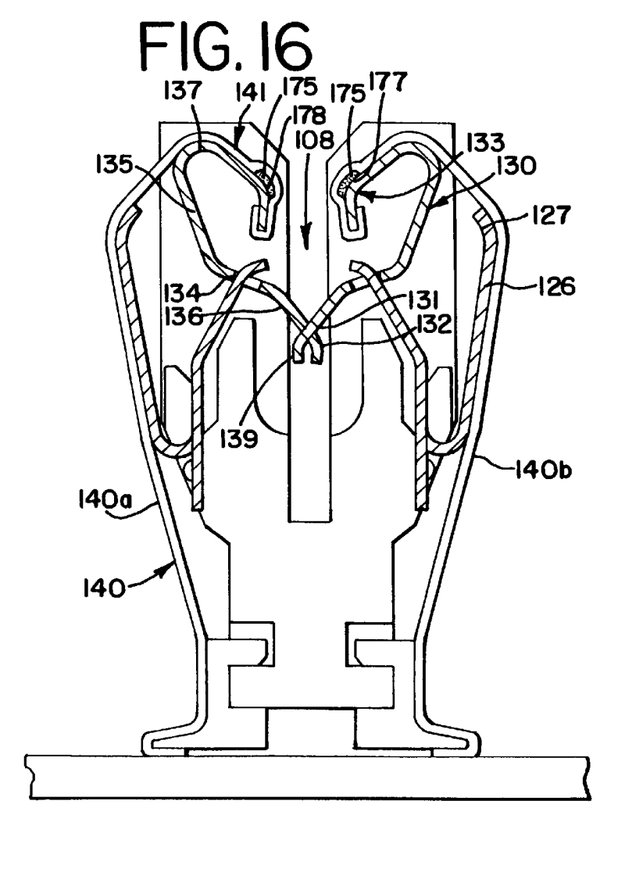
FIG. 16 is a sectional view of the connector of FIG, 5 in a first, or rest position without a circuit card inserted therein and illustrating the extent of interleaving of the contact spring leg portions.

In another important aspect of the present invention, and in a departure from the prior art, the contact springs 130, as illustrated in FIG. 6, have their bottom edges 131 slotted in a manner to contain alternating slots 138 and tabs 139. The tabs 138 of each contact spring 130 fit into the spaces defined by corresponding alternating slots 139 of their opposing contact spring 130. This fit may be considered as an "interleaved" fit as shown best in FIG. 16 and it serves to increase the width of the card-receiving opening formed by the two contact springs 130, especially the spring arm portions 135 thereof to an extent large enough that the flexible circuitry 140 does not contact the circuit card 103 during insertion thereof in a manner so as to cause damage to the conductive areas 141 of the flexible circuitry 140. By this interleaving of the contact spring tabs 139 together, the size of the circuit card opening 108 is increased to its maximum extent, without modifying functional movement of the contact springs 130.

The flexible circuitry 140 extends down from the contact spring arm portions 135 on opposite sides of the connector 100, beneath the base portion 102 and around a pair of support braces 150. These support braces 150 include hook portions 151 that engage opposing slots 152 and lugs 153 of the base portions 102 and further include outwardly extending foot portions 155. The bottom portions of the flexible circuitry 140 are bent around these feet 150 and contains second contacts 143 for connection to opposing circuits on the printed circuit board 101.

In another important aspect of the present invention, the cradle spring members 115 include a plurality of upstanding arm members 126 that are preferably integrally formed therewith. These arm members 126 are disposed between pairs of the attachment flanges 116 in the intervening slots 113, and as illustrated in FIG. 9 extend upwardly and slightly outwardly with respect to the attachment flanges 116 and the shoulder portions 120. The arms 126 may have bent free ends 127 that extend at an angle to the arms 126 and toward the apexes 137 of the upper spring arms 135 so as to gently contact the flexible circuitry 140 in a manner where no likelihood of puncturing or otherwise damaging the flexible circuitry 140 exists. They extend behind (or beneath) the flexible circuitry 140 and contact the rear sides 140 thereof. The positioning of these arm members 126 effectively places a predetermined amount of tension onto the flexible circuitry 140 and importantly serves to equally distribute and spread the force required to open the connector along the upper spring arms 135, without degrading the normal force that occurs in the contact area along the first contacts 141. They effectively hold the flexible circuitry 140 open during insertion of the circuit card 103.

Figures 17A, 17B:
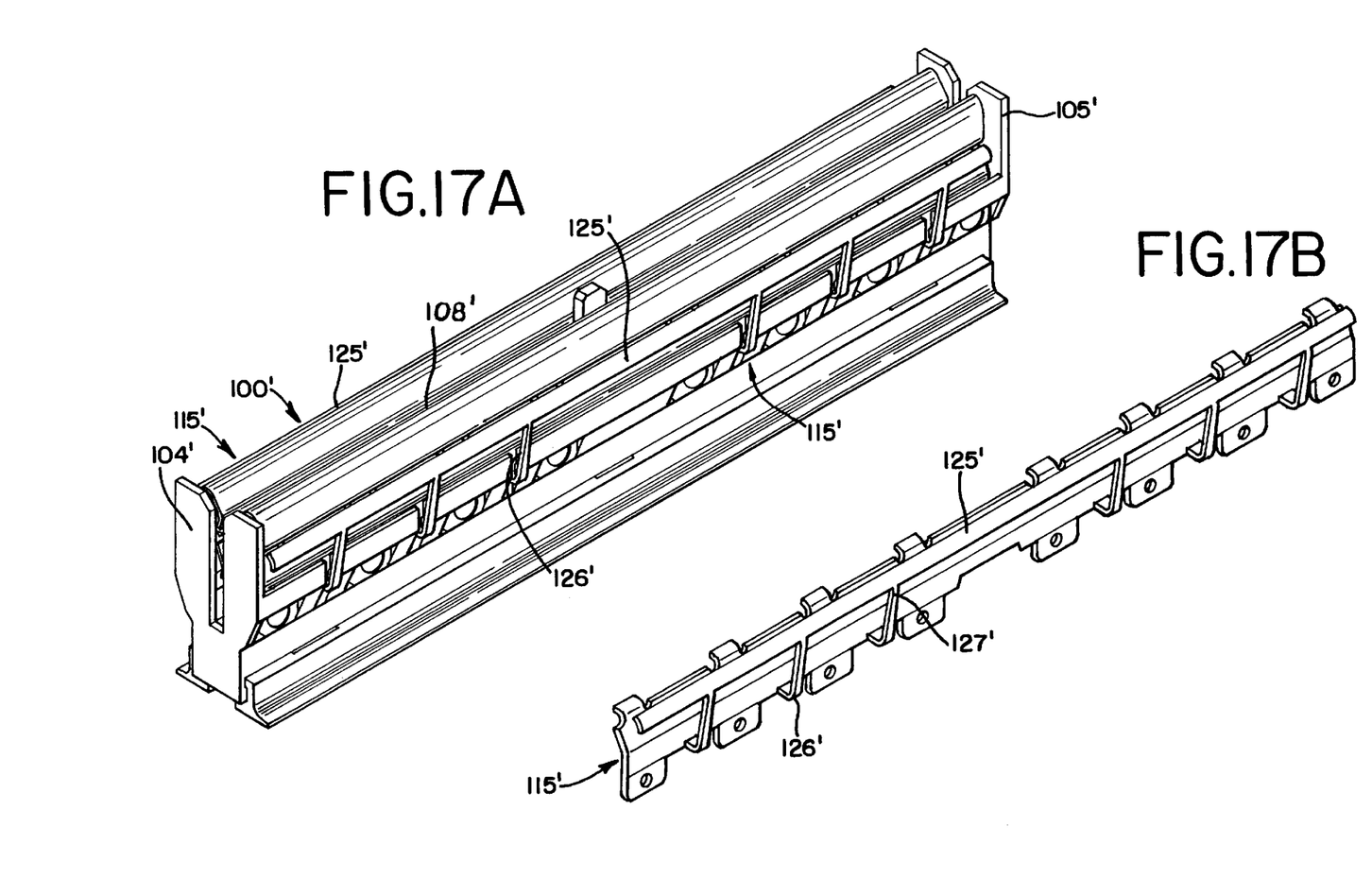

This reset assembly may also take the alternate form illustrated in FIGS. 17A and 17B, wherein the cradle spring members 115' have a series of upstanding arm members 126' formed therewith and where the arm members 126' do not have single free ends, but are interconnected by an elongated, commoning member 125' that extends for the length of the connector 100' between the endwalls 104', 105' thereof. This commoning member 125' connects or unifies the arm members 126' on each side of the card-receiving slot 108' and applies a continuous reset force R to the flexible circuitry, rather than a series of point forces as may be the case with the arm members 126 shown in FIGS. 5–9. This continuous force will avoid the possibility that indentations may form in the flexible circuitry due to misformation of the arm member free ends.

Figure 15:
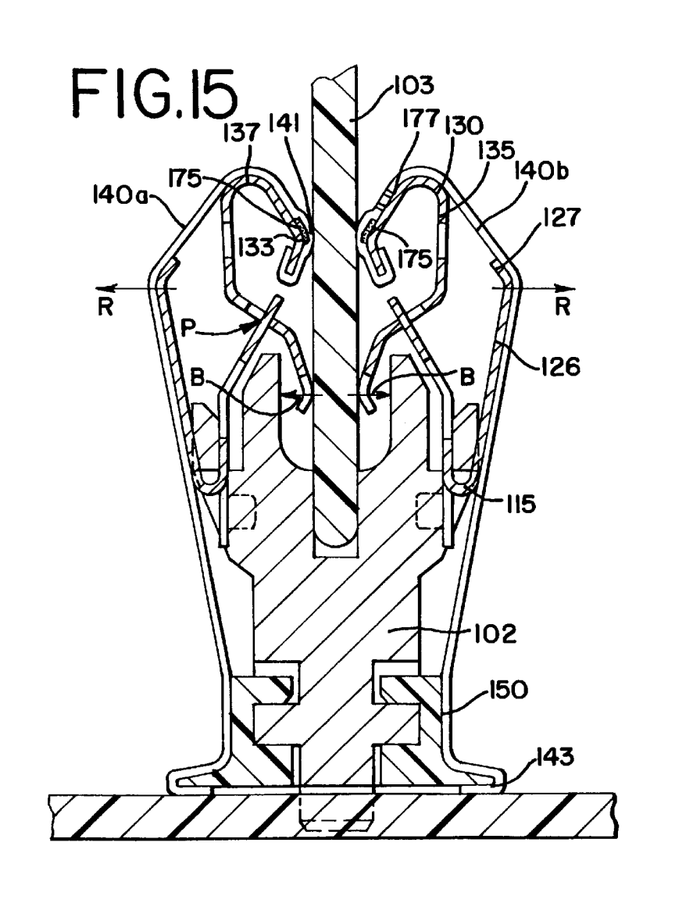
FIG. 15 is a cross-sectional view of the connector of FIG. 5, with a circuit card inserted therein.

As shown best in FIG. 15, the arm members 126 will exert a force, shown as R, on the flexible circuitry 140, outwardly in the direction illustrated. The circuit card 103 will exert a force against the contact spring lower legs 136, illustrated at B. The movement of the circuit card 103 against the spring legs 136 will cause the upper spring arms 135 to move against the circuit card and apply a normal force N at the first contacts 141 of the flexible circuitry 140. The arm member free ends 127 and the commoning members 125' are located in the connector assembly at a location that is above the point at which the contact springs 130 move (i.e., their fulcrums), shown at P in FIG. 15. As such, force R works slightly against force B and therefore lessens the opening force of the connector to a degree and renders it more uniform along the length of the connector 100. The arm members 126, because of their spacing intervals, act to uniformly distribute the opening force along the length of the connector 100 to thereby result in a more consistent spring opening.

Figure 10:
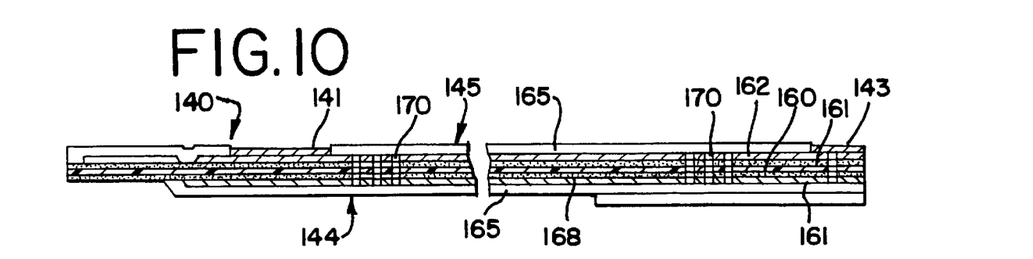
FIG. 10 is a cross sectional view of the flexible circuitry used in the connector of FIG. 5, with the flexible circuitry laid out in a horizontal plane.
Figure 11:
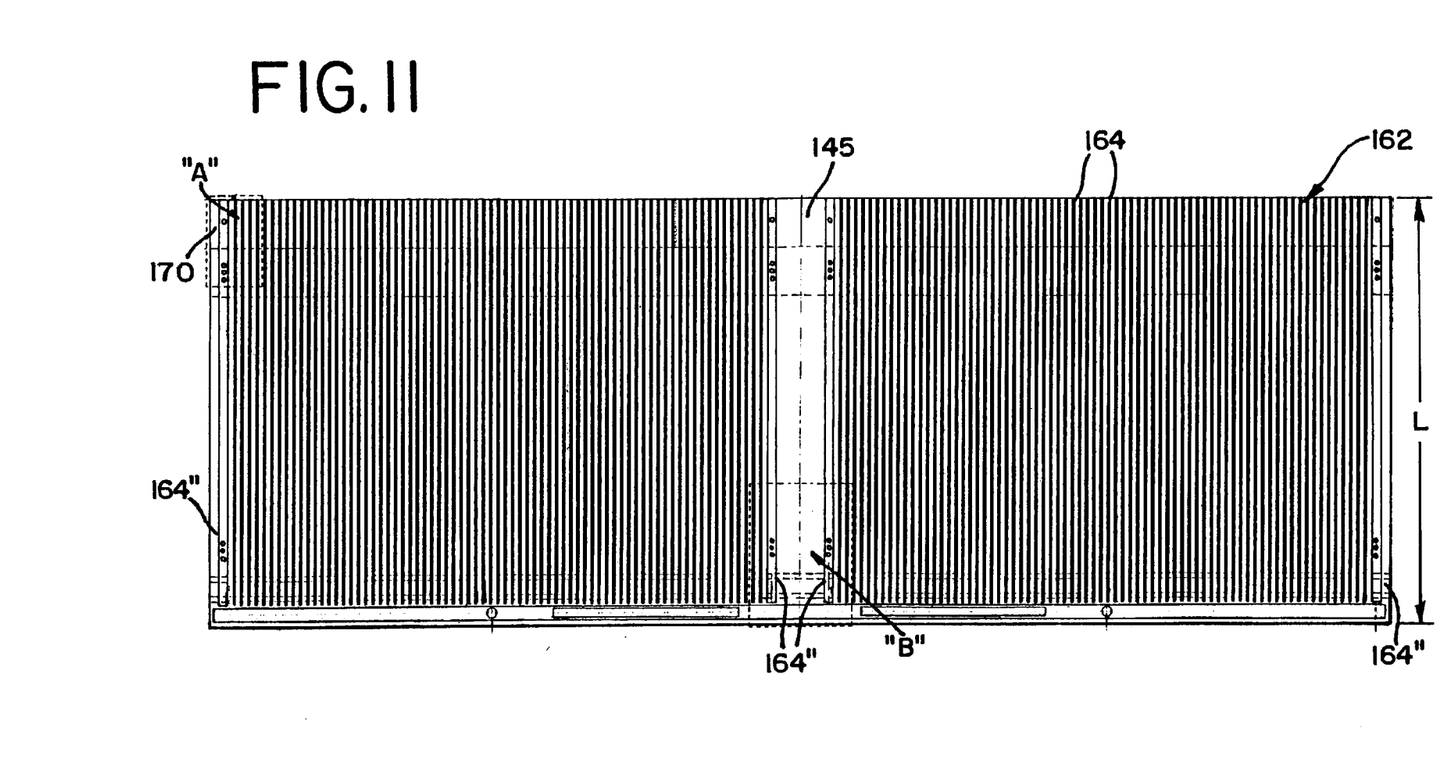
FIG. 11 is a plan view of the flexible circuitry of FIG. 10, taken from above and illustrates the signal trace pattern formed thereon.
Figure 12A:
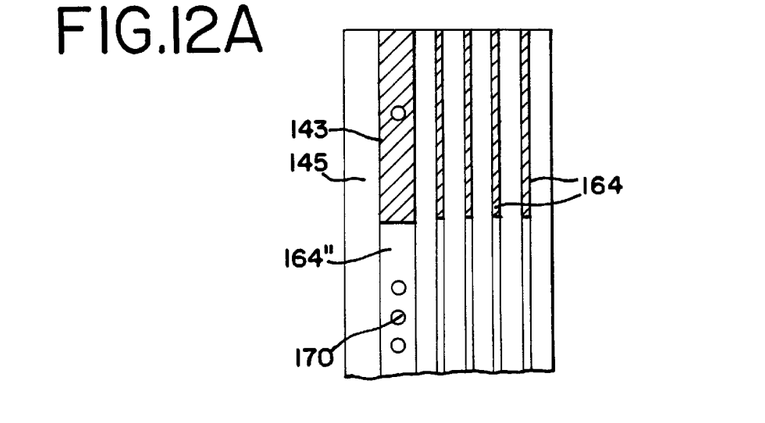
FIG. 12A is an enlarged detail view of a portion of FIG. 11, taken at area "A" thereof illustrating the flexible circuitry along the edge of the base.
Figure 12B:
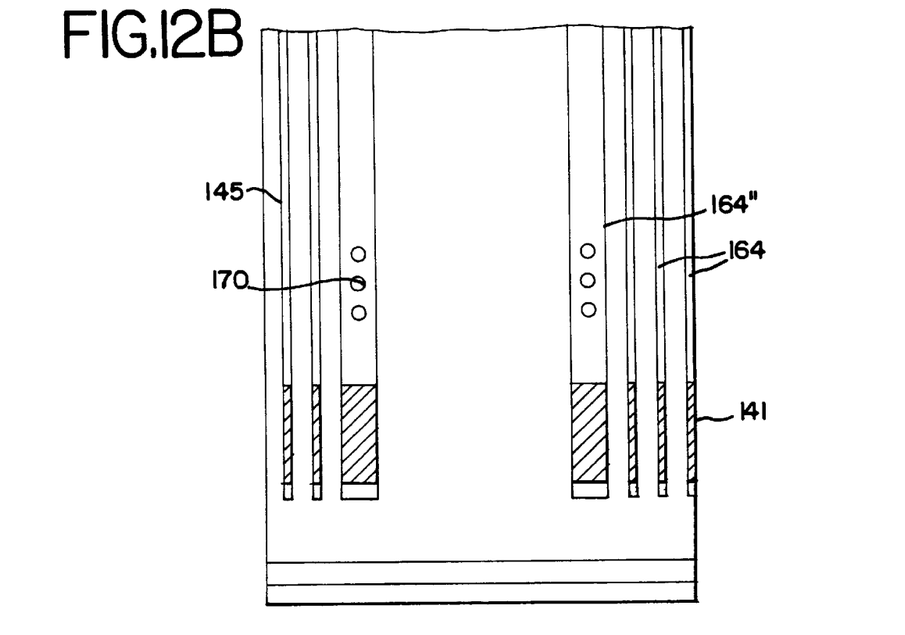
FIG. 12B is an enlarged detail view of another portion of FIG. 11, taken at area "B" thereof, illustrating the flexible circuitry along the center edge of the connector at the contact spring.

Turning now to FIGS. 10–14, the present invention also importantly provides an improved flexible circuitry structure that is more compliant and reliable than that of the prior art. As shown in FIG. 10, the flexible circuitry 140 includes a plurality of distinct layers that extend in alignment with each other. This construction includes a film base layer 160, preferably a polyamide film and two adhesive 161 layers, preferably an acrylic adhesive. On one side, shown on the top side in FIG. 10, a signal transmission layer 162 is present that includes a plurality of conductive traces 164 or extend for substantially the entire length L of the flexible circuitry. (FIG. 11.) In the circuit card contacting area 141, gold-plated contacts portions are preferably provided. Each such signal trace 164 is intended to mate with a corresponding contact pad on either the circuit card 103 and the printed circuit board 101. Some of the signal traces 164" are intended for ground connections, and are typically located at opposing ends of the arrays of signal traces 164. A protective and insulative cover layer 165 is provided above this transmission layer 162 and extends thereover except in the contact areas 141, 143.

A conductive ground plane layer 168 is provided beneath the transmission layer 162 and importantly extends substantially for the entire length L of the flexible circuitry 140, especially in the interconnection interface areas that coincide with the first and second contact areas 141, 143. The signal traces 164 may be plated in these areas to improve their conductivity. This ground plane layer 168 is covered by a insulative and protective cover layer 165. A series of holes 170 (FIG. 10) are provided and extend through the inner layers 160, 161, 162 and 168 in order to facilitate a complete ground connection to the ground traces 164" of the flexible circuitry 140 to the ground plane layer 168 through the body of the flexible circuitry 140. This reduces inductance caused by mismatches between circuit board contact pads and the solder leads of the flexible circuitry 140.

Figure 13:
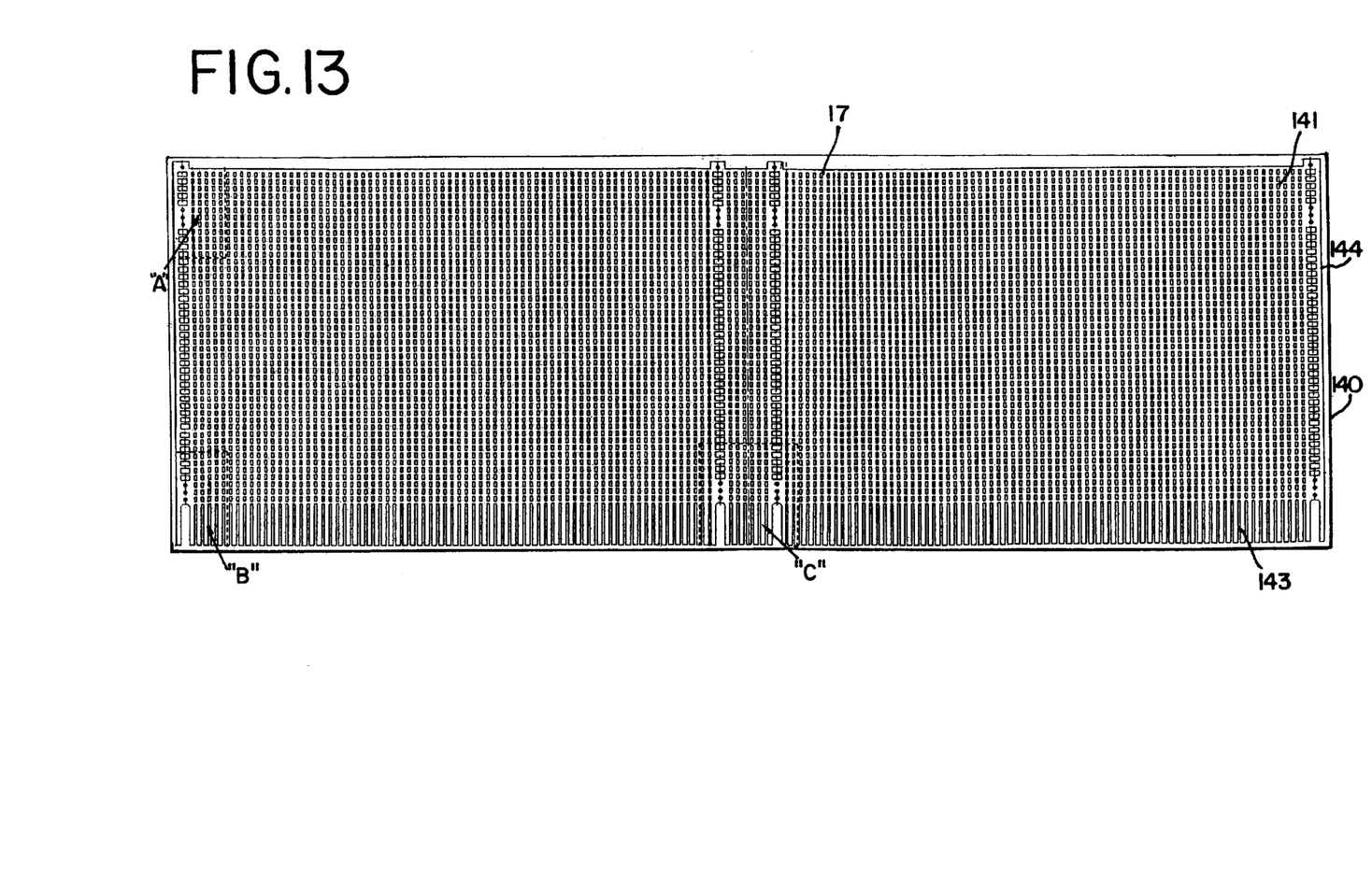
FIG. 13 is a plan view of the flexible circuitry of FIG. 10, taken from the bottom thereof and, illustrating the discontinuous ground plane pattern formed thereon.
Figure 14A:
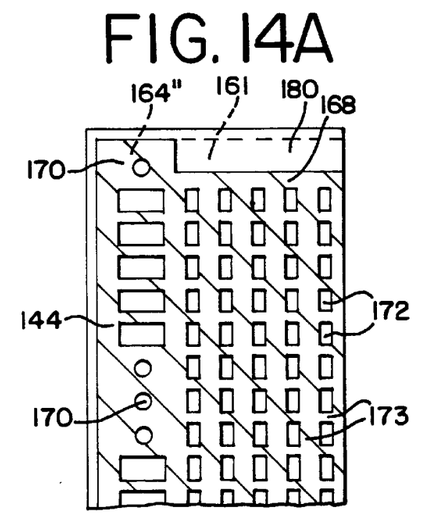
FIG. 14A is an enlarged detail view of FIG. 13 taken at area "A" thereof along the edge of the base of the connector.
Figure 14B:
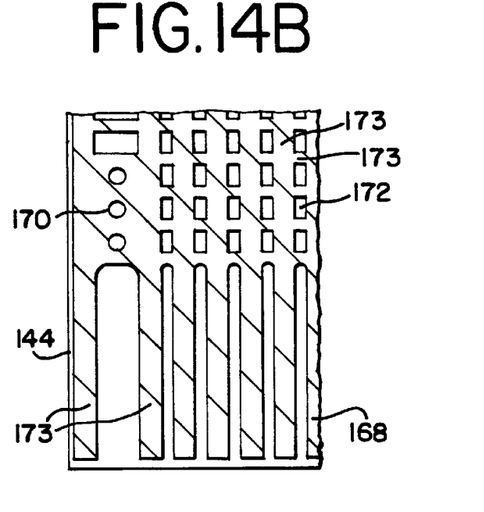
FIG. 14B is an enlarged detail view of FIG. 13, taken at area "B" thereof, along an end edge near the contact spring of the connector.
Figure 14C:
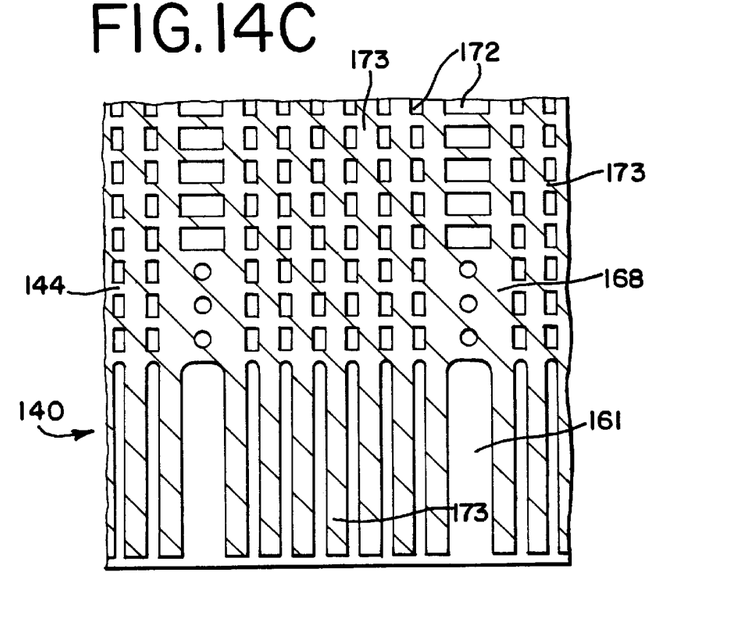
FIG. 14C is an enlarged detail view of FIG. 13, taken at area "C" thereof, along the center edge near the contact spring of the connector.

Turning now to FIG. 13, the ground plane layer 168 is apertured, rather than solid, and contains a plurality of apertures 172 arranged therein. The apertures 172 lie adjacent to each other in an array and are separated by continuous extents 173 of the ground plane layer 168 that may be considered to extend lengthwise and widthwise of each extent of flexible circuitry 140. This ground plane pattern is extended even into the first and second contact areas 141, 143 of the flexible circuitry 140 to maintain the ground plane of the connectors throughout the interconnection interfaces 141, 143. In the preferred embodiment, the apertures 172 are arranged so that they are aligned with the signal traces 164. The apertures increase the flexibility of the flexible circuitry 140 especially in the interconnection interfaces 141, 143 and enhances the ability to conform the flexible circuitry 140 to variations that may occur at the interconnecting interfaces 141, 143. A portion of the ground plane layer 168 may be removed, such as by etching, in part of the second conductive area 143 to improve the compliance thereof.

Returning to FIG. 15, a layer of compliant material 175 is preferably provided on the contact spring arms 135, preferably at the circuit card-contacting ridges 133 thereof. A solid silicone elastomer has been found to produce desirable results as this compliant layer. This compliant layer 175 extends for the length of the flexible circuitry 140 in the gold-plated contact area 141 thereof. It is preferably formed as one piece member, such as by extrusion, and preferably has a flat base portion 177 with a domed portion 178 having a predetermined radius on the opposite side thereof. This layer is applied in continuous lengths equal to that of the flexible circuitry 140 in the first conductive area 141 thereof. The compliant material layer 175 will serve to push the conductive areas 141 of the flexible circuitry 140 against their opposing contacts on the circuit card 103, no matter the variations found in the thickness or planarity of the circuit card 103.

Accordingly, it will be appreciated that the embodiments of the present invention which has been discussed herein is merely illustrative of a few applications of the principles of the invention. Numerous modifications may be made by those skilled in the art without departing from the true spirit and scope of the invention. For example, the configuration of the connector base portion may be modified to eliminate the support walls 112 thereof which may be replaced by elongated side panels. Additionally, the width of the upright arm members of the cradle spring halves may be increased or decreased, the lengths of the tabs and slots may be made larger or smaller as well as the size and shape of the ground plane apertures.

We claim:

1. An electrical connector effecting a connection between a plurality of first circuits on a circuit board and a plurality of second circuits on a circuit card, comprising: a connector body having two opposing end portions and a base extending lengthwise between the body end portions, the connector having a slot for receiving the circuit card therein, flexible circuitry supported by said connector body and disposed on opposite sides of the card-receiving slot, the flexible circuitry having first and second conductive portions disposed thereon, the first conductive portions being located within said card-receiving slot and the second conductive portions being located proximate to the connector base, and a pair of cradle spring halves supported on said connector body and spaced apart from each other on opposite sides of said card-receiving slot, the cradle spring halves having free ends projecting upwardly with respect to said card-receiving slot, a pair of contact springs movably supported by said free ends of said cradle springs along two lines of movement defined thereby on opposite sides of said card-receiving slot and extending lengthwise between said body end portions, said contact springs having defined arm and leg portions, the contact spring arm portions being disposed above said lines of movement and the contact spring leg portions being disposed beneath said lines of movement;

flexible circuitry extending lengthwise of said connector body on opposite sides of said card-receiving slot and being attached at one end thereof to said contact spring arm portions and being attached at the other ends thereof to said connector body;

said cradle spring halves including a plurality of upright arm portions extending upwardly therefrom disposed on opposite sides of said card-receiving slot and at predetermined intervals lengthwise of said connector, said upright arm portions extending along the undersides of said flexible circuitry and applying an outward force to said flexible circuitry during insertion of a circuit card into said card-receiving slot.

2. The connector as claimed in claim 1, wherein said connector body portion includes a plurality of vertical slots and said upright arm portions extend through said slots.

3. The connector as claimed in claim 1, wherein said contact springs include openings along the length thereof and said cradle spring halves includes engagement lugs along said free ends, said engagement lugs extending through said contact spring openings.

4. The connector as claimed in claim 1, wherein said upright arm portions have free ends and said upright arm portion free ends extend into contact with said flexible circuitry.

5. The connector as claimed in claim 1, wherein said upright arm portions on each side of said card-receiving slot are connected together by elongated commoning elements.

6. The connector as claimed in claim 5, wherein said commoning elements extend the length of said flexible circuitry.

7. The connector as claimed in claim 1, wherein said contact spring leg portions have free lower ends, each of the contact spring leg portion free lower ends having an alternating pattern of slots and tabs disposed thereon.

8. The connector as claimed in claim 7, wherein said contact spring leg portion free lower end tabs of one of said contact springs are interleaved with said contact spring leg portion free lower end slots of the other of said contact springs when said connector is in a condition ready to receive a circuit card within its card-receiving slot.

9. The connector as claimed in claim 7, wherein said contact spring leg portion free lower end tabs of one of said contact springs are interleaved with said contact spring leg portion free lower end slots of the other of said contact springs under urging of said upright arm portions.

10. The connector as claimed in claim 1, wherein said contact spring leg portions have free lower ends, each having an alternating pattern of slots and tabs disposed thereon and the contact spring leg portion free lower end tabs of one of said contact springs are interleaved with said contact spring leg portion free lower end slots of the other of said contact springs when said connector is in a condition ready to receive a circuit card within its card-receiving slot.

11. The connector as claimed in claim 7, wherein said contact spring arm portions include a compliant layer applied thereto aligned with said flexible circuitry first conductive portions.

12. The connector as claimed in claim 7, wherein said upright arm portions contact said flexible circuitry at points in said connector above said lines of movement.

13. The connector as claimed in claim 5, wherein said commoning members interconnect said upright arm portions and are located in said connector above said lines of movement.

14. The connector as claimed in claim 1, wherein said flexible circuitry includes a signal transmission layer having a plurality of conductive signal traces formed thereon, a ground plane formed from a layer of conductive material, and an intervening base layer, the ground plane being apertured and having a plurality of openings formed in its conductive material, said apertured ground plane extending into said first and second conductive areas of said flexible circuitry, and said openings thereof increasing flexibility of said flexible circuitry in said first and second conductive areas.

15. The connector as claimed in claim 14, wherein said ground plane openings in said flexible circuitry second conductive areas include slots.

16. A circuit card connector for providing an electrical connection between a plurality of contacts disposed on a circuit board and a plurality of contacts disposed on a printed circuit card, the circuit card having an insertion edge that is insertable into and removable from said connector, said connector comprising:

a connector body, the connector body having a connector base for mounting upon the circuit board;

two extents of flexible circuitry disposed on said connector body on opposing sides of said card-receiving slot;

a pair of contact springs mounted on said connector body and spaced apart from each other to define a circuit card-receiving slot along the length of the connector body, said connector body having a pair of fulcrums disposed on opposite sides of said card-receiving slot, said contact springs being movably along said fulcrums between first and second operative positions, said contact springs and having distinct spring arm and leg portions;

said flexible circuitry having first ends that extend within said card-receiving slot and which contain thereon first conductive portions for contacting said circuit card contacts, said flexible circuitry having second ends that extend along said connector body base and which contain thereon second conductive portions for contacting said circuit board contacts when said connector body is mounted to said circuit board;

said contact spring arm portions being disposed above said fulcrums and said spring leg portions being disposed beneath said fulcrums, said flexible circuitry first conductive portions being supported by said contact spring arm portions and said flexible circuitry second conductive portions extending along said connector base, said contact spring leg portions extending into said card-receiving slot and said contact spring arm portions extending away from said card-receiving slot in said first operative position where no circuit card is present in said card-receiving slot and said contact spring leg portions extending away from said card-receiving slot and said contact spring arm portions extending into said card-receiving slot in said second operative position where said circuit card is inserted into said card-receiving slot, said contact spring leg portions each having a plurality of tabs and slots formed thereon in an alternating pattern extending lengthwise of said contact springs and in an interleaved fashion between said two contact springs such that each tab of one of said two contact spring leg portions faces opposing slots on the other of said two contact spring leg portions and vice-versa, whereby, when said contact springs are in said first operative position, said tabs on said one contact spring leg portion are received within said slots on said other contact spring leg portions and vice-versa, thereby permitting said contact spring arm portions and said flexible circuitry first conductive portions to open wider to permit entrance of said circuit card insertion edge into said card-receiving slot.

17. The connector of claim 16, wherein said connector body includes a cradle spring assembly and said cradle spring assembly includes a pair of cradle springs disposed on opposite sides of said card-receiving slot, each of said cradle springs including a plurality of arm members extending upwardly therefrom and into contact with undersides of said flexible circuitry.

18. The connector of claim 17, wherein said cradle spring arm members include free ends that contact said undersides of said flexible circuitry.

19. The connector of claim 17, further including a pair of commoning members that join said cradle spring arm members together and which extend lengthwise along said connector body on opposite sides of said card-receiving slot.

20. The connector of claim 19, wherein said commoning members extend underneath said flexible circuitry and extend for the length of said flexible circuitry.

21. The connector of claim 17, wherein said contact spring leg portions are interleaved together in said first position under urging of said cradle spring arm members.

22. The connector of claim 17, further including a compliant layer interspersed between said contact spring arm portions and said flexible circuitry first conductive portions, the compliant layer raising said flexible circuitry first conductive portions partly away from said contact spring arm portions.

23. The connector of claim 22, wherein said compliant layer extends for the length of said contact springs.

24. The connector of claim 22, wherein said compliant layer includes a flat base portion and a raised, domed portion on opposite sides of said compliant layer.

25. An electrical connector of the type that provide a connection between a circuit-card and circuit board by way of flexible circuitry, the connector comprising:

two opposing connector body end portions, an elongated connector base extending between said connector body end portions, the connector base having a first surface for supporting a circuit card engagement assembly and a second surface that opposes a mounting surface of said circuit board, said connector card engaging assembly further including a cradle assembly and a pair of contact springs movably supported on the cradle assembly, the contact springs extending lengthwise of said connector and being spaced apart from each other along their length to define a circuit card-receiving slot therebetween, flexible circuitry supported by said contact springs and having a plurality of first conductive portions adapted to contact corresponding contacts on said circuit card when said circuit card is inserted into said connector and said flexible circuitry having second conductive portions that extend beneath said connector and are adapted for contacting corresponding contacts positioned on the circuit board mounting surface, said flexible circuitry including a base layer, a plurality of individual signal traces disposed on a first side of said base layer, the signal traces facing generally outwardly of said connector, and a continuous, apertured ground plane layer disposed on a second side of said base layer opposite that of said first side, the ground plane layer facing generally inwardly of said connector, said apertured ground plane including a plurality of openings formed therein in a preselected pattern, said ground plane layer extending along said base layer second side and extending into said flexible circuitry first and second conductive portions, said openings of said ground plane layer in said flexible circuitry first and second conductive portions increasing the flexibility of said flexible circuitry in said first and second conductive portions.

26. The connector as set forth in claim 25, wherein said ground plane layer openings are aligned with said signal traces.

27. The connector as set forth in claim 25, wherein said connector includes a compliant layer disposed on each of said contact springs, the compliant layers being aligned with and extending lengthwise of said contact springs underneath said flexible circuitry first conductive portions.

* * * * *